(54) ELECTROLYTIC CLEANING OF CONDUCTIVE BODIES

(75) Inventors: John E. Hoffman, Jr., Hummelstown; Richard A. Hoffman, Sr., Harrisburg, both of PA (US)

(73) Assignee: Hoffman Industries International, Ltd., Harrisburg, PA (US)

(*) Notice: Subject to any disclaimer, the term of this patent is extended or adjusted under 35 U.S.C. 154(b) by 0 days.

(21) Appl. No.: 09/157,176

(22) Filed: Sep. 18, 1998

(51) Int. Cl.$^7$ ........................................... C25F 1/00
(52) U.S. Cl. .................. 205/705; 205/712; 204/242; 204/275.1; 204/224 R
(58) Field of Search .................. 205/705, 712; 204/242, 275.1, 224 R

(56) References Cited

U.S. PATENT DOCUMENTS

| | | |
|---|---|---|
| Re. 34,227 | 4/1993 | Asher et al. ............ 204/141.5 |
| 1,337,718 | 4/1920 | Mason . |
| 1,369,271 | 2/1921 | Edison . |
| 1,954,473 | 4/1934 | Dunn ............................ 204/1 |
| 2,307,928 | 1/1943 | Hogaboom ................ 204/141 |
| 2,395,694 | 2/1946 | Hooker et al. ............... 134/2 |
| 2,468,006 | 4/1949 | Webster ...................... 204/145 |
| 2,615,840 | 10/1952 | Chapman .................. 204/141 |
| 2,775,535 * | 12/1956 | Poole ......................... 205/705 |
| 2,801,215 | 7/1957 | Webster ...................... 204/145 |
| 3,313,714 * | 4/1967 | Joyce et al. ................ 205/705 |
| 3,666,667 | 5/1972 | Wieczorek .................. 252/87 |
| 3,668,090 | 6/1972 | Sallo et al. ............... 204/145 R |
| 3,715,292 | 2/1973 | Wieczorek ............... 204/145 R |
| 3,756,931 | 9/1973 | De Boer ................... 204/141.5 |
| 3,796,645 | 3/1974 | Fujita et al. ............. 204/141.5 |
| 4,039,410 | 8/1977 | Davidoff ................... 204/141.5 |
| 4,046,592 | 9/1977 | Westervelt et al. .......... 134/1 |
| 4,129,485 | 12/1978 | Shikata et al. ............ 204/144.5 |
| 4,305,795 | 12/1981 | Weaver ...................... 204/140 |
| 4,481,090 | 11/1984 | Childs .................... 204/129.75 |
| 4,493,756 | 1/1985 | Degen et al. ............. 204/141.5 |
| 4,545,885 | 10/1985 | Hori et al. ................. 204/207 |
| 4,966,664 | 10/1990 | Buerk et al. ............... 204/146 |
| 4,968,397 | 11/1990 | Asher et al. .............. 204/141.5 |
| 5,104,501 | 4/1992 | Okabayashi ............. 204/141.5 |
| 5,141,606 | 8/1992 | Matsumoto et al. ....... 204/145 R |
| 5,268,045 | 12/1993 | Clare ......................... 148/518 |
| 5,362,370 | 11/1994 | van der Heijden ...... 204/141.5 |
| 5,478,450 | 12/1995 | Buck ......................... 204/141.5 |
| 5,534,126 | 7/1996 | Stadler et al. .............. 205/101 |
| 5,584,984 | 12/1996 | Pempera et al. ............ 205/704 |
| 5,700,366 * | 12/1997 | Steblianko et al. ......... 205/219 |
| 5,795,460 | 8/1998 | Al-Jiboory et al. ......... 205/705 |

FOREIGN PATENT DOCUMENTS

| | | |
|---|---|---|
| 201 378 | 3/1978 | (CS) . |
| 41-19841 | 6/1971 | (JP) .......................... 205/712 |

OTHER PUBLICATIONS

"Simple Electrolytic Method for Removal of Rust", Wang, Jua–Qi (Shanghai Dye Works No. &), 1974 with English Translation No month available.

* cited by examiner

*Primary Examiner*—Arun S. Phasge
(74) *Attorney, Agent, or Firm*—Carmen Santa Maria; McNees, Wallace & Nurick

(57) ABSTRACT

A method and apparatus for cleaning conductive bodies using a basic aqueous disodium phosphate and sodium bicarbonate electrolyte. The outside surfaces of a metallic body is cleaned by placing the body in contact with the electrolyte and flowing DC current from an anode to the body, which forms a cathode. The body may be immersed in the electrolyte or the electrolyte may be sprayed onto the body.

31 Claims, 2 Drawing Sheets

ELECTROLYTIC CLEANING OF CONDUCTIVE BODIES

FIELD OF THE INVENTION

The invention relates to methods and equipment for cleaning electrically conductive bodies.

BACKGROUND OF THE INVENTION

Bodies capable of conducting electricity, including bodies made entirely of metal and bodies having both metallic and nonmetallic portions, often have outer surfaces that need to be cleaned. Rust, scale, smut, petroleum derived contaminants, flux, carbonization, nonmetallic coatings, corrosion, dirt and the like may form or be deposited on the surface of the body. These surface deposits or contaminants must be removed so that the body may be recycled and reused or to prepare the body for subsequent surface treatment. Examples of metallic bodies that may require cleaning include grocery carts, metallic brake shoes, jewelry, and electronic circuit boards.

An early method of cleaning metal bodies immerses the bodies in a high temperature cyanide bath. Major ingredients of the cyanide bath include caustic soda and sodium cyanide or potassium cyanide. The bath is heated to a temperature in excess of 700 degrees F. All of the cyanide and alkali materials are limited in life and have to be discarded and entirely fresh bath solutions made. The cyanide bath has the potential of liberating deadly cyanide gas, and the cyanide bath itself is a hazardous waste that requires special and expensive waste treatment and disposal.

To overcome the disadvantages of the cyanide bath, a variety of electrolytic cleaning systems were developed. Many of these systems use caustic soda (NaOH) to form a highly alkaline caustic soda bath. Caustic soda attacks galvanized steel, brass, bronze, copper, aluminum, magnesium, titanium and other metals. The caustic soda attacks the metal itself. Even if the metal could withstand immersion in the caustic soda bath, subsequent brushing or spraying treatments may be needed to remove tenacious impurities. The caustic soda bath is highly corrosive and requires special care in handling and disposal.

Other electrolytic cleaning systems have been proposed. One electrolytic system uses an electrolyte solution containing ferric sulfate and ammonium bifluoride. This system may generate objectionable fumes. The system does not de-scale or de-smut. A sludge containing insoluble salts of such metals as aluminum, copper, brass and bronze is generated that must be disposed of as a hazardous waste. Another electrolytic system uses an electrolyte solution composed of a phosphate alkaline material heated to 160–190 degrees F. Metallic ions, such as lead, tin, zinc or cadmium ions act as catalysts in the solution for removal of scale from stainless steel. These metallic ions remain in the spent electrolyte and require hazardous waste treatment and disposal. A film of metal may be deposited on the surface of the treated object. The film may be acceptable in cleaning stainless steel, but would be totally unacceptable in cleaning surfaces of other metallic objects such as circuit boards.

Yet another known method of cleaning is directed to consumer cleaning of gold, silver, coins and jewelry. The object to be cleaned is immersed in an electrolyte and a relatively low voltage and amperage electric current is passed through the electrolyte solution. The method is designed specifically to remove tarnish, which are sulfides of gold and silver. During cleaning, hydrogen sulfide gas is created. Hydrogen sulfide is a noxious, poisonous gas that would present a serious problem in commercial operation.

The above conventional methods of cleaning metallic bodies require extremely high operating temperatures, toxic chemicals or highly corrosive liquids. These conventional methods are designed primarily to remove rust, scale or smut from iron or steel bodies, and are not suitable for cleaning of other types of metallic bodies. The methods generate hazardous wastes that must be disposed of in compliance with environmental regulations and at high cost. Immersing the metallic body in the electrolyte may also be inefficient, as only a small number of bodies may be treated at a time.

Thus, there is a need for an improved method and apparatus for conductive cleaning bodies. The improved method should clean a wide variety of bodies, and should not be limited to iron or steel. The improved method should use non-toxic materials that are non-hazardous to personnel and should not require special disposal. The improved method should be efficient and allow the cleaning of a large number of bodies at the same time. Treatment to clean the bodies should not harm the bodies.

SUMMARY OF THE INVENTION

The present invention is an improved electrolytic method and apparatus for cleaning conductive bodies. Two embodiments are disclosed.

In the first embodiment, a conductive body to be cleaned is immersed in a specialized basic electrolytic bath and connected to the cathode of a direct current power source. The anode of the source is immersed in the bath. The resulting electrolysis weakens the attachment of deposits and contaminants to the outer surfaces of the body. The cleaned body may be lightly rinsed after removal from the bath to remove any debris remaining on the body.

In the second embodiment, the specialized basic electrolyte is sprayed from one or more spray nozzles onto the body to be cleaned. The body is connected to the cathode of a direct current power source. The anode of the source is connected to each spray nozzle. The metallic body is washed in a continuous stream of electrolyte. Resulting electrolysis weakens the attachment of foreign matter to the outer surfaces of the article. The electrolyte spray may wash off foreign matter from the metallic body. Electrolyte sprayed on the body is collected, filtered and recycled.

The electrolyte spray allows larger bodies such as transformer cases, shopping carts, extruded and sheet steel, boilers and the like to be cleaned on site. It is not necessary to transport the bodies to a bath. Bodies that are too large to be immersed in a bath or which cannot be moved to a bath can be cleaned using an electrolyte spray.

If desired, a plurality of metallic bodies can be electrolytically spray cleaned at the same time. The bodies are placed in electrical contact with each other and one body is attached to the cathode. Electrolyte spray is sprayed onto all the bodies for simultaneous electrolysis and cleaning of all the bodies. The bodies could move through an electrolyte spray on a conveyor belt to spray clean a continuous stream of bodies.

In both embodiments, the electrolyte is an aqueous solution of disodium phosphate and sodium bicarbonate having a pH greater than 7 and less than 9.0, preferably in the pH range of 8.0 to 8.5. In this pH range the electrolyte is not corrosive, is non-hazardous to personnel and is environmentally friendly. The electrolyte can be disposed of by conventional means, and does not have to be treated and disposed of as a hazardous waste.

Temperature ranges for successful cleaning of metallic bodies extend from just above the freezing point of the electrolyte to just below the boiling point of the electrolyte. The preferred operating temperature of the electrolyte is between about 55 degrees F. and 90 degrees F.

The electrolyte has a long useful life, whether used in the bath or discharged as a spray. The liquid component of the electrolyte needs replenishment only due to the evaporation of liquid from the electrolyte. Other components of the electrolyte are replenished as needed to maintain the specific gravity of the electrolyte. The specific gravity of the electrolyte can range from between about 1.5 to about 2.50, and is preferably between about 1.86 to about 2.15.

Cleaning of metallic objects does not contaminate the electrolyte. When used as a bath, metal oxides and other metallic residues removed from the metallic bodies sink to the bottom of the bath. Nonmetallic residues float on the surface of the bath. Both residues can be easily removed from the electrolyte bath by occasionally collecting each into separate containers. Sprayed electrolyte can be collected, filtered to remove residues and then reused. The residues are not hazardous and can be disposed of through normal channels.

Other objects and features of the invention will become apparent as the description proceeds, especially when taken in conjunction with the accompanying drawings illustrating the invention, of which there are three sheets and two embodiments.

DESCRIPTION OF THE PREFERRED EMBODIMENTS

Figure 1:
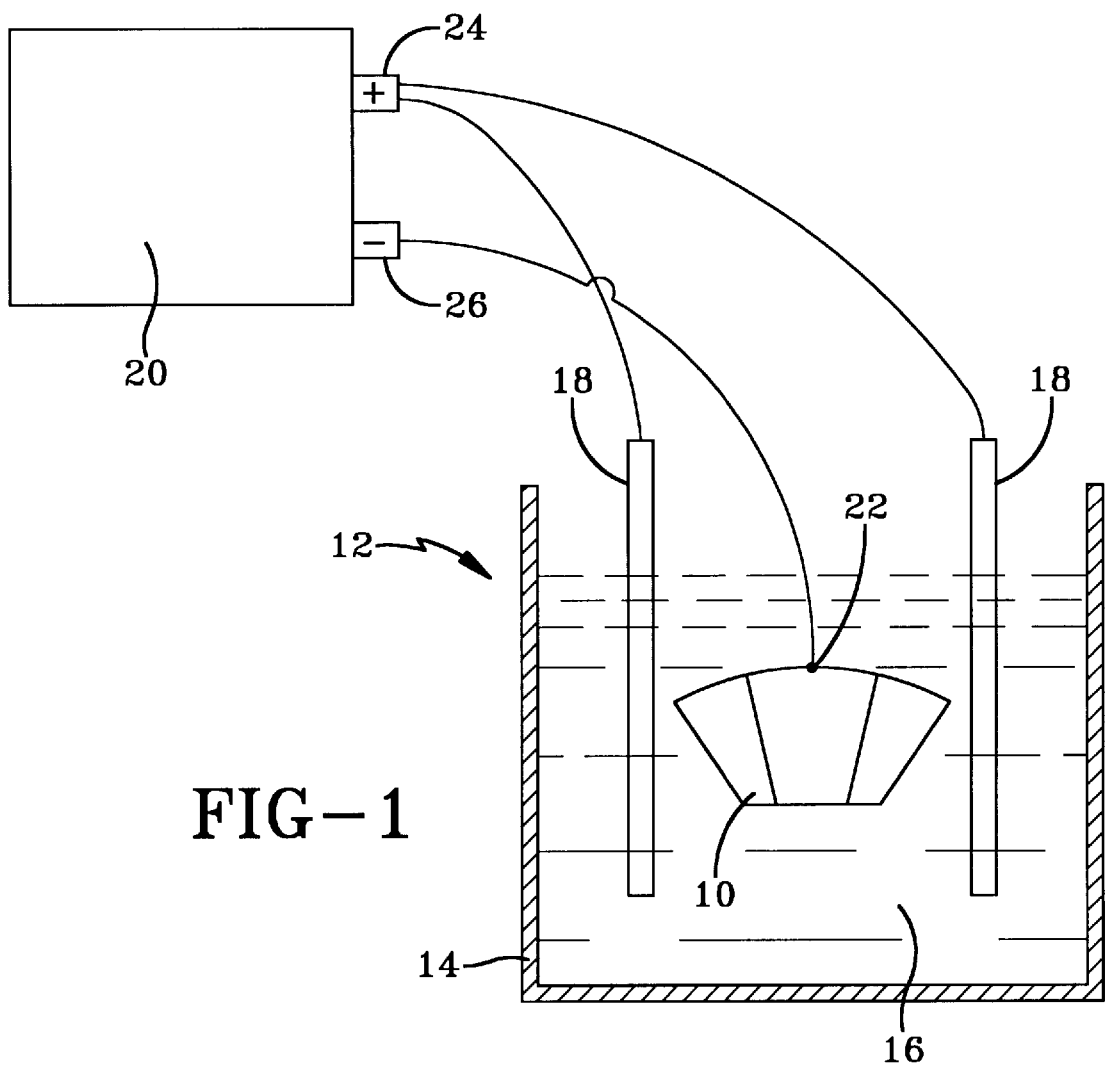
FIG. 1 is a schematic diagram of a brake shoe (without brake pads) immersed in an electrolyte for cleaning.

FIG. 1 illustrates a brake shoe 10 immersed in an electrolyzer 12 for cleaning the outer surfaces of the brake shoe. Brake shoe 10 is steel and typically has surface rust and other contaminants that must be removed to allow painting of the brake shoe. Electrolyzer 12 includes a nonmetallic container or vat 14 holding a basic electrolyte 16, one or two anodes 18, a power supply direct current source 20, and a cathode contact 22. As shown in FIG. 1, brake shoe 10 is immersed into electrolyte 16 and is connected to cathode contact 22. Anodes 18 are connected to the positive output terminal 24 of source 20. The cathode contact 22 is connected to the negative output terminal 26 of source 20.

Electrolyte 16 is an aqueous basic solution made of water, disodium phosphate and baking soda (sodium bicarbonate, $NaHCO_3$). The disodium phosphate is preferably food grade disodium phosphate. Preferably 1.25 pounds of disodium phosphate and 0.34 pounds of baking soda are dissolved in each gallon of water to form the electrolyte.

The exact pH of electrolyte 16 is not critical as long as the pH is in the basic range and has a pH greater than 7.0 and less than 9.0. The preferred range of pH of electrolyte 16 is between 8.0 and 8.5 inclusive. In this pH range the electrolyte is not corrosive and is environmentally friendly. The temperature of electrolyte 16 may range from just above the freezing point of the electrolyte to just below the boiling point of the electrolyte. The preferred temperature of electrolyte 16 is between 55 degrees F and 90 degrees F. The specific gravity of electrolyte 16 is between 1.50 and 2.50. The preferred specific gravity of electrolyte 16 is 1.86 to 2.15.

In the preferred embodiment, anodes 18 are made of stainless steel rods. Power supply 20 produces a low voltage direct current output from 5 to 350 DC amps output from a 60 hz, 230 v, 3 phase alternating current source. Power supply 20 can be an Invertec V300-Pro power source manufactured by The Lincoln Electric Company of Cleveland, Ohio. Other power supplies and anodes may be used.

As shown in FIG. 1, brake shoe 10 is totally immersed into electrolyte 16 and is connected as the cathode of power supply 20. Power supply 20 is energized to flow current across electrolyzer 12 for cleaning the outer surfaces of brake shoe 10. During normal cleaning, power supply 20 is energized for from 2 to 3 minutes per brake shoe, depending on the severity of surface contaminants that need to be removed from the brake shoe. During cleaning bubbles of $CO_2$ gas is evolved. The bubbles agitate the electrolyte adjacent the part 10. The agitation may help in mechanically removing surface contaminants and may aid in cleaning the brake shoe 10. No toxic or environmentally hazardous gases are evolved. Most surface contaminants removed from the brake shoe sink to the bottom of vat 14 and forms a sludge. Other surface contaminants may float on the top of electrolyte 16. The sludge and floating residue are physically removed by occasionally collecting each into separate containers. The sludge and floating residue are non-hazardous and may be disposed of through normal channels. Brake shoe 10 can be left in the electrolyte 16 for extended periods of time without damage to the brake shoe 10 itself.

After treatment of a brake shoe 10 in electrolyzer 12, power supply 20 is deactivated. The brake shoe is removed from electrolyte 16 and disconnected from cathode contact 22. The brake shoe is lightly rinsed with water to remove any loose debris still adhering to the brake shoe.

After rinsing, the outer surfaces of brake shoe 10 have been cleaned and are ready for any post-cleaning surface treatment. For example, the brake shoe may be dried and subsequently painted.

Electrolyte 16 is long lasting in treating metal bodies without draining or adding of additional constituent materials, although water may be added as required to replace water lost through evaporation. Sludge and floating residues are periodically removed from the electrolyte. The specific gravity of electrolyte 16 is checked regularly and additional disodium phosphate and baking soda are added in proper proportion to electrolyte 16 to maintain the specific gravity of the electrolyte in its preferred range of between 1.86 and 2.15 inclusive.

Stainless steel anodes 18 generally are not sacrificed during electrolysis and are used continuously. Other types of anodes may act as sacrificial anodes and should be inspected and replaced as necessary.

FIG. 1 illustrates a single brake shoe 10 immersed in electrolyzer 12 for cleaning. However, a number of brake shoes in contact with each other can be immersed in electrolyzer 12 for simultaneous cleaning of the brake shoes. One of the brake shoes is connected to cathode contact 22. The other brake shoes touch the brake shoe connected to cathode contact 22 or form a series of brake shoes that contact one another and include the brake shoe connected to cathode contact 22. Alternatively, vat 14 could be made from stainless steel and connected to the negative terminal 26 of power supply 20 to form the cathode of electrolyzer 12. The brake shoes would contact vat 14 to be connected to the cathode.

Figure 2:
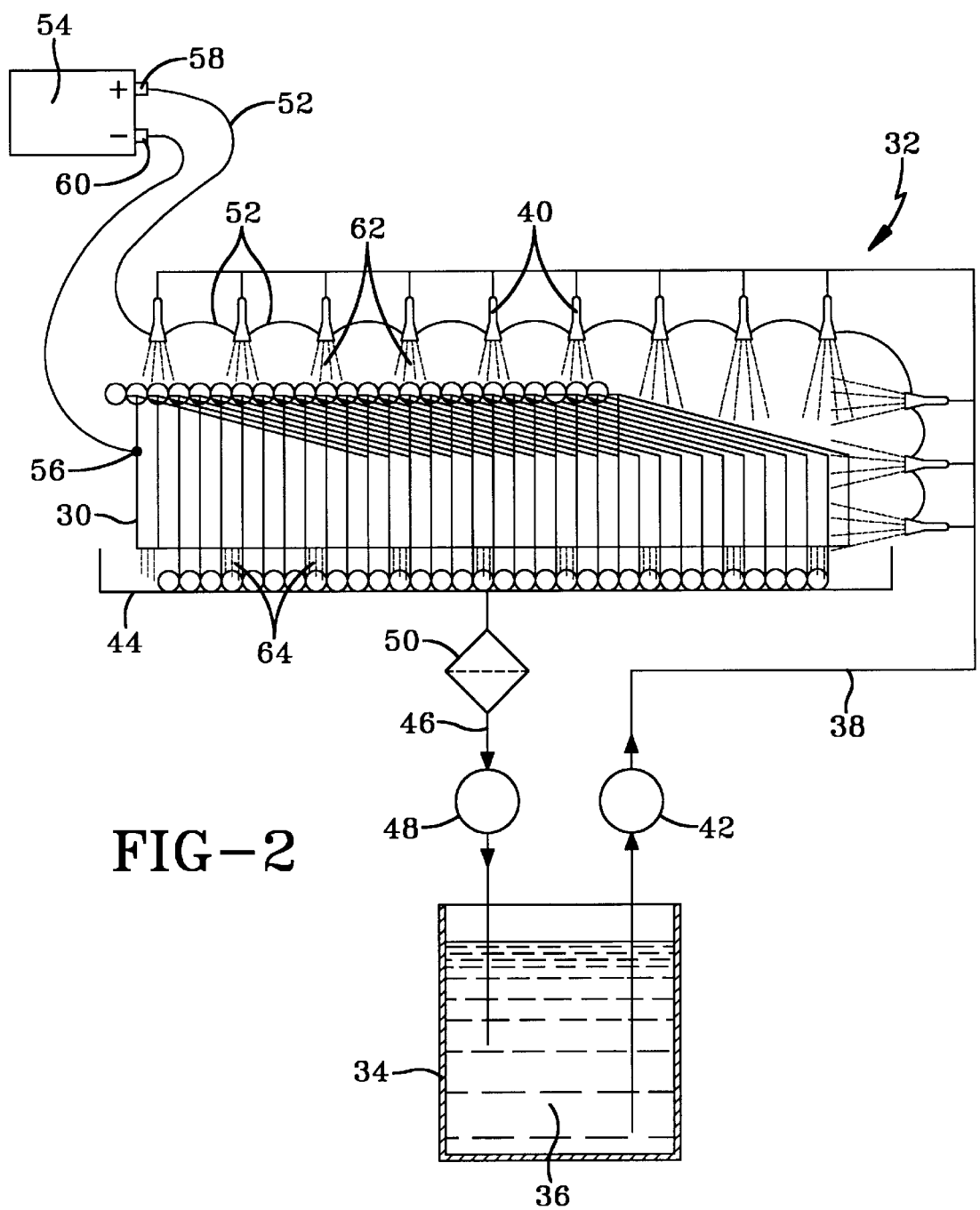
FIG. 2 is a schematic diagram of a plurality of grocery carts being sprayed with electrolyte for cleaning the outer surfaces of the grocery carts.

FIG. 2 illustrates a plurality of grocery carts 30 located in a spray washer 32 for cleaning the outer surfaces of grocery carts 30. Each grocery cart 30 includes a basket formed from steel rods. The basket is mounted on a wheeled base. The cart is electrolytically plated. Typically, carts are plated by forming a layer of nickel-chrome alloy overlying the ferrous body or a layer of zinc overlying the ferrous body.

In use, grocery carts are often left exposed to the outdoor environment where water collects on the body of the grocery cart. The underlying ferrous body is exposed to this water at breaks in the plating. A galvanic process oxidizes the exposed iron. Water with oxidized iron flows over the exterior plated surfaces of the body and forms a thin layer of deposited rust on top of the plating. The deposited rust is believed to adhere to the plating layer by chemical bonds. This layer is unsightly and dulls the appearance of the cart. To restore the appearance of the cart, the deposited rust on the outer surfaces of the grocery cart must be removed.

Spray washer 32 includes a reservoir 34 containing a supply of electrolyte 36. A supply line 38 extends from reservoir 34 to a plurality of spray nozzles 40. Feed pump 42 in supply line 38 pumps electrolyte from the reservoir to the spray nozzles. A drain basin 44 collects sprayed electrolyte which flows into return line 46. The returned electrolyte passes through filter 50 and flows to drain pump 48 in line 46 for return to reservoir 34. Nozzles 40 form a plurality of anodes and are connected to the positive terminal of direct power supply 54.

As shown in FIG. 2, grocery carts 30 are nested or pushed together in contact with one another. The nested grocery carts are surrounded by spray nozzles 40. The spray nozzles 40 are oriented to discharge electrolyte towards the grocery carts and are each located about 2 inches away from the grocery carts.

One of the nested grocery carts is connected to cathode contact 56. The remaining grocery carts are connected in series to cathode contact 56 by the mutual contact between each of the nested grocery carts. Cathode contact 56 is connected to the negative output terminal 60 of power supply 54.

Electrolyte 36 is identical to electrolyte 16 and power supply 54 is identical to power supply 20.

Supply pump 42 is energized to provide a flow of electrolyte 36 to each spray nozzle 40. As shown in FIG. 2, each nozzle 40 directs a stream or streams 62 of electrolyte against the grocery carts. Power supply 54 is energized to provide an electric current for electrolytic cleaning the outer surfaces of grocery carts 30. During normal cleaning, power supply 54 is energized for about 45 minutes to clean 40 nested grocery carts. During cleaning, electrolyte 36 is sprayed onto the grocery carts 30. Each stream of sprayed electrolyte strikes the grocery carts 30 and flows to adjacent areas of the grocery carts that are not directly in the spray path of the nozzles or impinged by an electrolyte stream. Some of these areas 64 are represented in FIG. 2. Nozzles 40 are arranged so that the entire surface area of the grocery carts is wetted by sprayed, splashed or dripped electrolyte to assure electrolytic treatment of the entire surface area.

Figure 3:
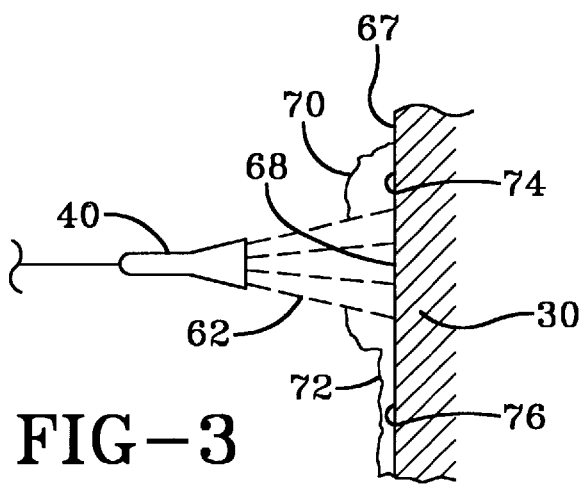
FIG. 3 is a schematic diagram of a surface of a grocery cart being cleaned by the sprayed electrolyte.

FIG. 3 illustrates in greater detail the electrolytic treatment of the surface of a cart. Nozzle 40 flows a continuous stream 62 of electrolyte onto a surface 67 of a grocery cart 30. The stream directly impacts or impinges on a small area 68 of surface 67. Impingement area 68 forms part of the cathode and is electrically connected to the anode by stream 62. Electrolytic cleaning takes place on surface area 68.

Some electrolyte bounces off surface 67 and forms a mist or fog 70 surrounding the impact area 68. The electrolyte mist 70 is sufficiently dense to be electrically conductive and forms a portion of the electrical circuit between the anode and cathode. Other electrolyte from the streams from impact area 68 along surface 76 and wets a surface area considerably larger than the area of impingement 68. The surface electrolyte 72 flowing from area 68 remains in fluid connection with electrolyte stream 62 and remains a part of the electrical circuit between the anode and the cathode so that a greatly enlarged surface area is cleaned. Electrolytic activity occurs on surface area 74 of surface 67 in contact with electrolyte mist 70 and the wetted portion of surface 76 in contact with the stream. These areas can greatly increase the area of electrolytic cleaning around area 68.

The surface area cleaned by a stream 62 is not limited to the surface area directly impinged by the stream. The nozzles 40 are preferably arranged to maximize the surface areas 74, 76 wetted by electrolyte and electrically connected with the anode, and to overlap these areas so that the entire surfaces of the carts are electrolytically cleaned. Wetting of the surfaces of the carts is aided by gravity flow of electrolyte down the carts and by surface tension wetting of recesses and valleys on the surfaces of the carts.

Drain basin 44 collects the sprayed electrolyte and directs the collected electrolyte into drain line 46. Filter 50 filters contaminants from the drained electrolyte prior to being returned to reservoir 34. Drain pump 48 pumps the filtered electrolyte back to reservoir 34 for reuse. The electrolyte can be continuously pumped out of the reservoir, sprayed onto the grocery carts and returned to the reservoir.

After cleaning of grocery carts 30 in spray washer 32, power supply 54 is deactivated. The grocery carts are disconnected from cathode contact 56 and are removed from spray washer 32. The grocery carts are rinsed with water to remove any loose debris still adhering to the carts.

After rinsing, the outer surfaces of the grocery carts 30 are clean and are ready for post-cleaning surface treatment. For example, the grocery carts may be dried and a polyurethane coating subsequently applied.

Electrolyte 36 is long lasting in treating metal bodies without draining reservoir 36 or adding of additional constituent materials, although water may be added as required to replace water lost through evaporation. Residues and contaminants washed off the metal bodies are removed by filter 50. The specific gravity of electrolyte 36 is checked regularly and additional disodium phosphate and baking soda is added in proper proportion to electrolyte 36 as necessary to maintain the specific gravity of the electrolyte in its preferred range of between 1.86 and 2.15.

Stainless steel anodes 52 generally are not sacrificed during electrolysis and are used continuously. Other types of anodes may act as sacrificial anodes and should be inspected and replaced as necessary.

The streams of electrolyte spray electrically connect the anodes to the metallic body or bodies being cleaned by spray washer 32. It is important that the electrolyte discharged from the nozzles 40 be in continuous streams extending from the anode to the metallic body. The electrolyte supplied to the nozzles is supplied at a pressure of between about 25 pounds per square inch and 1500 pounds per square inch, and preferably between about 600 pounds per square inch and about 800 pounds per square inch to prevent separation of the streams into droplets. The length of the streams from the nozzles to the body being cleaned should be two inches or less in order to maintain the electrical continuity of the stream. It is believed that streams longer than two inches separate into separate droplets and cannot support electrolysis.

The number, location and orientation of spray nozzles 40 can be varied to conform to the shape of the object or objects being cleaned to assure wetting by the electrolyte and to maintain electrical stream continuity. The objects being cleaned could be placed on a conveyor to move through the electrolyte spray. The objects would be exposed to the spray for a sufficient time to be cleaned. Alternatively, the nozzles could move and the objects being cleaned could remain stationary. The spray washer could be mounted on a truck to allow spray washing of large or immobile objects such as over-the-road trailers and aircraft. One or more spray nozzles could be attached to a flexible supply line to permit an operator to direct the electrolyte spray where needed.

The following examples of cleaning metallic bodies further illustrate the invention.

EXAMPLE 1

An electrolyte solution was prepared by dissolving disodium phosphate at a concentration of about 1.25 pounds per gallon of water and sodium bicarbonate at a rate of about 0.34 pounds per gallon of water. The volume of electrolyte was sufficient to form a bath sufficient to totally submerge approximately 1800 pounds of shredded or whole used aluminum cans. The outer surfaces of the cans were coated with laquer paint and printing inks. Two stainless steel electrodes were placed in the solution and connected to the positive terminal of a direct power supply. The negative terminal of the power supply was connected to the submerged aluminum cans. The power supply was energized and 80 to 95 amps were flowed through the electrolyte. In approximately 20 minutes, all the laquer paint and printing inks were removed from the cans and bare metal was exposed. The power supply was deenergized and the aluminum cans removed from the bath. The cans were rinsed to remove debris and recycled.

EXAMPLE 2

An electrolyte bath was prepared as in Example 1. The volume of the bath was sufficient to totally submerge 100 used commercial brake shoes, with brake lining removed. The electrodes and power supply terminals were connected as in Example 1 and the power supply was activated as in Example 1. After 20–30 minutes the power supply was deactivated and the brake shoes removed from the bath. Each brake shoe was lightly rinsed to remove debris. The brake shoes were sufficiently clean to paint for reuse.

EXAMPLE 3

An electrolyte bath was prepared as in Example 1. The volume of the bath was sufficient to totally submerge 40 used chrome plated grocery carts. The electrodes and power supply terminals were connected and activated as in Example 1. After 30–40 minutes the power supply was deactivated and the grocery carts were removed from the bath. The grocery carts were washed to remove loose debris and a coating was applied to protect the cleaned carts from weathering. The finished surfaces of the carts were restored to almost new condition.

EXAMPLE 4

An electrolyte was prepared as in Example 1. The volume of electrolyte was sufficient to fill a 400 gallon holding tank attached to a pump supplying a spray system mounted in another tank in which 40 used chrome plated grocery carts were placed. The grocery carts were nested with the carts electrically contacting one another. The negative terminal of a direct current power supply was connected to the grocery cars. The positive terminal of the power supply was connected to a series of nozzles positioned to flow streams of electrolyte on the carts. The power supply was activated along with the spray system. The stream pattern of the nozzles wetted all of the grocery cart surfaces. Excess electrolyte was drained from the cart tank, filtered and pumped to the pump holding tank for reuse. After 45 minutes, the power supply and spray system were deactivated and the grocery carts were removed. Each cart was power washed to remove loose debris and coated to protect against weathering. The surfaces of the carts were restored to almost new condition. The carts contained plastic components which were not affected by cleaning.

EXAMPLE 5

Same as Example 3, except zinc plated grocery carts were cleaned. After cleaning, the carts were restored to almost new condition.

EXAMPLE 6

Same as Example 4, except zinc plated grocery carts were cleaned. After cleaning, the carts were restored to almost new condition.

EXAMPLE 7

An electrolyte bath was prepared as in Example 1. The volume of the bath was sufficient to totally submerge a used motor vehicle engine head. The electrodes and power supply were connected and activated as in Example 1. After 10–30 minutes the power supply was deactivated and the head was removed from the bath and rinsed to remove loose debris. The head was in almost new condition free from rust and other foreign matter.

EXAMPLE 8

An electrolyte bath was prepared as in Example 7. The volume of the bath was sufficient to totally submerge rusted and carbonized steel bars. The bars contacted each other. The electrodes and power supply were connected and activated as in Example 9. After 20 minutes the power supply was deactivated and the steel bars were removed from the bath. The steel bars were rinsed to remove loose debris and appeared to be in almost new condition.

EXAMPLE 9

Example 7 was repeated but, instead of submerging the engine head in electrolyte, the engine head was sprayed using the technique used in Example 4. The cleaned engine head appeared in almost new condition.

EXAMPLE 10

Example 8 was repeated but, instead of submerging the steel bars in electrolyte, the steel bars were sprayed using the technique used in Example 4. The cleaned steel bars appeared in almost new condition.

EXAMPLE 11

An electrolyte bath was prepared as in Example 1. The volume of the bath was sufficient to totally submerge an oxidized, greasy and glazed copper bus bar. The electrodes and power supply were connected and activated as in Example 1. After 10 minutes the power supply was deactivated and the bus bar was removed from the bath. After cleaning the bus bar was restored to almost new condition without any visible chemical degradation of the surface.

EXAMPLE 12

Example 13 was repeated but, instead of submerging the copper bus bar in electrolyte, the bus bar was sprayed for 10–15 minutes using the same technique as in Example 4. The cleaned bus bar was restored to almost new condition without any visible chemical degradation of the surface.

EXAMPLE 13

An electrolyte bath was prepared as in Example 1. The volume of the bath was sufficient to totally submerge an oxidized, glazed painted transformer casing. It was desired to remove the oxidation from the steel casing but to leave painted areas unharmed. The electrodes and the power supply were connected and activated as in Example 1. After 10–15 minutes the power supply was deactivated and the transformer casing was removed from the bath. After cleaning the transformer casing was restored to almost new condition without any damage to the unit. The paint was unharmed. If it were desired to remove the paint from the casing, the power supply would have been activated for a longer time to remove the paint.

EXAMPLE 14

Example 13 was repeated but, instead of submerging the painted transformer casing in electrolyte, the transformer casing was sprayed for 10–15 minutes using the same technique as in Example 4. The cleaned transformer was restored to almost new condition without any damage to the unit or to the paint. If removal of paint were desired, the transformer casing would have been sprayed a longer time to remove the paint.

EXAMPLE 15

An electrolyte bath was prepared as in Example 1. The volume of the bath was sufficient to totally submerge 50 brass fittings. The electrodes and power supply were connected and activated as in Example 1. After 5 minutes the power supply was deactivated and the brass fittings were removed from the bath. The brass fittings were rinsed to remove debris. The brass fittings were restored to almost new condition with no evidence of degradation.

EXAMPLE 16

An electrolyte bath was prepared as in Example 1. The volume of the bath was sufficient to totally submerge a variety of stainless steel parts, sheets and bars. The electrodes and power supply were connected and activated as in Example 1. After 10–15 minutes the power supply was deactivated and the stainless steel parts were removed from the bath. The stainless steel parts were restored to almost new condition with no chemical degradation evident.

EXAMPLE 17

Example 16 was repeated but, instead of submerging the stainless steel parts in electrolyte, the stainless steel parts were sprayed using the same technique as in Example 4. The stainless steel parts were restored to almost new condition with no chemical degradation evident.

EXAMPLE 18

An electrolyte bath was prepared as in Example 1. The volume of the bath was sufficient to totally submerge 50 computer circuit boards. The negative terminal of the power supply was connected to the metallic portions of the circuit boards. The positive terminal of the power supply was connected as in Example 1. The power supply was energized as in Example 1. After 5 minutes the power supply was deactivated and the circuit boards were removed from the bath. The circuit boards were rinsed and air dried. Inspection of the circuit boards showed complete removal of all foreign matter, including excessive flux, grease and oil. Not only were the metal surfaces cleaned, but the nonmetallic portions of the boards were also cleaned. It is theorized that the $CO_2$ bubbles generated during electrolysis of the metal portions of the circuit boards mechanically cleaned the adjacent nonmetal portions of the circuit boards, but the exact mechanism which cleaned the nonmetallic portions is not known.

EXAMPLE 19

Example 18 was repeated but, instead of submerging the circuit boards in electrolyte, the circuit boards were sprayed using the same technique as in Example 4. The spray system used in Example 4 was modified to accommodate the surfaces of the boards. The results were identical to Example 18. It is theorized the flow of electrolyte mechanically cleaned the adjacent nonmetal portions of the circuit boards, but the exact mechanism which cleaned the nonmetallic portions is not known.

EXAMPLE 20

An electrolyte bath was prepared as in Example 1. A variety of gold, silver and copper jewelry was electrolytically treated using the submersion technique described in Example 1. Electrolytic treatment was applied for 1 to 1.5 minutes. The jewelry was removed, air dried and inspected. All tarnish and oxidation was removed and the jewelry was restored to almost new condition.

While we have illustrated and described a preferred embodiment of our invention, it is understood that this is capable of modification, and we therefore do not wish to be limited to the precise details set forth, but desire to avail ourselves of such changes and alterations as fall within the purview of the following claims.

What we claim as our invention is:

1. A method of cleaning impurities and oxides from the surface of a conductive body, the method comprising the steps of:
   (a) forming a basic electrolyte having a pH in excess of 7.0 and not more than about 9.0 by dissolving disodium phosphate and baking soda in water and placing the electrolyte in a container;
   (b) positioning an anode in the electrolyte;
   (c) immersing a conductive body in the electrolyte;
   (d) connecting the body to a negative terminal of a direct current source and connecting the anode to a positive terminal of a direct current source; and
   (e) flowing current from the source through the electrolyte and the body to remove impurities and oxides.

2. The method of claim 1 including the step of:
   (f) dissolving about 0.34 pounds of baking soda in each gallon of electrolyte.

3. The method of claim 2 including the step of:
   (g) dissolving about 1.25 pounds of disodium phosphate in each gallon of electrolyte.

4. The method of claim 1 including the step of:
   (f) forming an electrolyte having a specific gravity between about 1.5 and about 2.5.

5. The method of claim 1 further comprising the step of:
(f) forming the electrolyte at room temperature.

6. The method of claim 1 wherein said body includes a metal portion and a nonmetal portion and including the steps of:
(f) connecting the metal portion to the negative terminal of a direct current source; and
(g) cleaning the surface of the non-metal portions.

7. An electrolyzer for cleaning bodies that can conduct electricity comprising:
a vat;
a basic electrolyte having a pH greater than 7.0 and no more than about 9.0 and comprising water, disodium phosphate and baking soda, said electrolyte contained within said vat;
at least one anode located in said electrolyte;
a cathode contact, said cathode contact located to form a cathode of said electrolyzer when said cathode connection is connected to a body that can conduct electricity immersed in said electrolyte; and
a direct current source having a positive terminal and a negative terminal, said positive terminal connected to said anode and said negative terminal connected to said cathode contact.

8. The electrolyzer of claim 7 wherein said basic electrolyte comprises baking soda at a concentration of about 0.34 pounds of baking soda per gallon of water.

9. The electrolyzer of claim 8 wherein said basic electrolyte comprises disodium phosphate at a concentration of about 1.25 pounds of disodium phosphate per gallon of water.

10. The electrolyzer of claim 7 wherein said electrolyte has a temperature between 55° F. and 90° F.

11. The electrolyzer of claim 7 wherein said electrolyte has a specific gravity between about 1.5 and about 2.5.

12. The electrolyzer of claim 7 wherein said vat comprises said cathode contact.

13. A method for cleaning a conductive body, the method comprising the steps of:
(a) connecting a conductive body to a negative terminal of a direct current source;
(b) connecting an anode to a positive terminal of the direct current source;
(c) spraying the body with a continuous stream of electrolyte to wet the body with electrolyte, said electrolyte comprising disodium phosphate, baking soda and water and having a pH greater than about 7.0 and less than about 9.0;
(d) locating the anode in physical contact with the continuous stream of electrolyte while the body is being sprayed; and
(e) flowing current from the source through the stream of electrolyte and the body to clean the body.

14. The method of claim 13 including the step of:
(f) cleaning a spray impingement area of the body and an area of the body away from the impingement area.

15. The method of claim 14 including the step of:
(g) flowing electrolyte from the impingement area down to the wetted area.

16. The method of claim 13 further comprising the step of:
(f) forming the electrolyte at a temperature between 55° F. and 90° F.

17. The method of claim 13 including the steps of:
(f) providing an electrolyte formed by mixing about 0.34 pounds of baking soda and about 1.25 pounds of disodium phosphate per gallon of electrolyte.

18. A spray washer to clean a conductive body comprising:
a reservoir;
a basic electrolyte comprising water, disodium phosphate and baking soda, said electrolyte having a pH between about 7.0 and about 9.0 and contained within said reservoir;
a spray nozzle connected to said reservoir for spraying the body with a continuous stream of electrolyte to wet the body with electrolyte;
an anode for physically contacting a continuous stream of electrolyte when said nozzle is spraying the body;
a cathode for contacting the body to form an electrical connection extending from the anode through the stream and the body to the cathode; and
a power supply having a positive terminal and a negative terminal, said positive terminal connected to said anode and said negative terminal connected to said cathode.

19. The spray washer of claim 18 wherein said electrolyte is at room temperature.

20. The spray washer of claim 18 further including at least one of:
a drain basin connected to said reservoir for returning sprayed electrolyte to said reservoir;
a filter connected between said drain basin and said reservoir for filtering returned electrolyte;
a drain pump connected between said drain basin and said reservoir for pumping electrolyte from said drain basin to said reservoir; and
a feed pump connected between said reservoir and said nozzle to pump electrolyte from said reservoir to said nozzle.

21. The spray washer of claim 18 wherein said nozzle comprises said anode.

22. The spray washer of claim 18 wherein said electrolyte has a specific gravity between about 1.5 and about 2.5.

23. The spray washer of claim 18 wherein said electrolyte comprises baking soda at a concentration of about 0.34 pounds of baking soda per gallon of electrolyte and disodium phosphate at a concentration of about 1.25 pounds of disodium phosphate per gallon of electrolyte.

24. The spray washer of claim 18 wherein said electrolyte is discharged from said nozzle at a pressure between about 25 pounds per square inch and about 1500 pounds per square inch.

25. A method of removing impurities and oxides from the surface of a conductive body, the method comprising the steps of:
(a) providing an electrolyte comprising water, disodium phosphate and sodium bicarbonate and having a pH greater than about 7.0 and less than about 9.0;
(b) providing an anode and connecting the anode to a positive terminal of a power supply)
(c) providing a body to be cleaned and connecting the body to a negative terminal of a power supply;
(d) maintaining a body of electrolyte extending between the anode and the body; and
(e) flowing current from the positive terminal through the electrolyte to the negative terminal to remove impurities and oxides from the surface of the body.

26. The method of claim 25 including the step of:
(f) placing a body of electrolyte in a reservoir; and
(g) immersing the body in the reservoir.

27. The method of claim 25 including the step of:

(f) spraying electrolyte from the anode to the body.

28. The method of claim 27 including the steps of:

(g) impinging a stream of electrolyte on the body; and (h) flowing impinged electrolyte along the surface of the away from the impinging stream for removing impurities spaced from the impinging electrolyte stream.

29. The method of claim 28 including the step of:

(g) forming a conductive mist of electrolyte about the impinging electrolyte and in contact with the body for removing impurities and oxides spaced from the impinging electrolyte stream.

30. The method of claim 27 including the step of:

(g) collecting the electrolyte sprayed onto the body;

(h) filtering the collected electrolyte to remove contaminants; and (i) respraying the filtered electrolyte from the anode to the body.

31. The method of claim 25 further comprising the step of:

(f) forming the electrolyte at a temperature between 55° F. and 90° F.

* * * * *